July 30, 1963 T. C. T. NEW ET AL 3,099,588

FORMATION OF SEMICONDUCTOR TRANSITION REGIONS
BY ALLOY VAPORIZATION AND DEPOSITION

Filed March 11, 1959

WITNESSES:

Bernard R. Giegue

Charles L. Menzemer

INVENTORS
Thorndike C. T. New and
James Pappas.
BY
Frederick Shapoe
ATTORNEY 3,099,588
Patented July 30, 1963

1

3,099,588

FORMATION OF SEMICONDUCTOR TRANSITION REGIONS BY ALLOY VAPORIZATION AND DEPOSITION

Thorndike C. T. New, Hempfield Township, Westmoreland County, and James Pappas, North Huntingdon Township, Westmoreland County, Pa., assignors to Westinghouse Electric Corporation, East Pittsburgh, Pa., a corporation of Pennsylvania Filed Mar. 11, 1959, Ser. No. 798,648
6 Claims. (Cl. 148—1.5)

This invention relates to a process for the fabrication of semiconductor devices and more particularly to a process for fabricating a semiconductor device by the vapor deposition of a doping alloy upon the surface of a semiconductor material.

In the past attempts have been made to alloy aluminum to semiconductive materials, particularly germanium, to form an emitter of high efficiency. It is however difficult to solder additional connections to aluminum. Attempts have been made to overcome this difficulty by evaporating a second metal, for example, silver, over the aluminum. The shortcomings of this method are well known to those skilled in the art.

An object of the present invention is to provide an improved process for the preparation of a semiconductor device by vapor depositing from a single container an aluminum-indium doping alloy upon a surface of a body of semiconductor material.

Other objects of this invention will, in part, appear hereinafter and will, in part, be obvious.

For a better understanding of the nature and the objects of the invention, reference should be had to the following detailed description and drawings, in which.

In accordance with the present invention and attainment of the foregoing objects, there is provided a process for forming a semiconductor device which comprises vapor depositing a readily solderable homogeneous doping alloy, the major component being aluminum and the minor component being indium, upon a body of a semiconductor material while maintaining the body of the semiconductor material at a temperature above the solidus temperature of the eutectic of the aluminum with the semiconductor material, and below the melting point of the aluminum.

It has been discovered that if aluminum and indium are melted in such fashion that a miscible solution of aluminum and indium is produced, the vapors from such a solution will have a composition correlated to the liquid composition.

It has been discovered that if a closed capsule of aluminum containing a core of indium is heated the indium will melt inside the aluminum shell. When the remainder of the aluminum melts a miscible alloy is formed.

2

Figure 1:
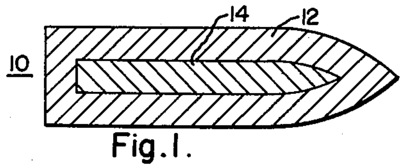
FIGURE 1 is a view in cross section of a pellet of doping alloy components suitable for use in accordance with this invention.

More specifically and with reference to FIG. 1, there is illustrated a capsule or pellet 10 comprising a shell 12 of aluminum and a core 14 of indium. The pellet 10 may comprise from 90% to 10% by weight of aluminum and from 10% to 90% by weight of indium. One particularly satisfactory method for preparing the doping alloy pellet 10 comprises taking a rod of solid aluminum and drilling a passageway partially therethrough. The passageway is then filled with indium, silver or a mixture thereof and the open end of the pellet pinched shut or plugged or otherwise closed.

Figure 2:
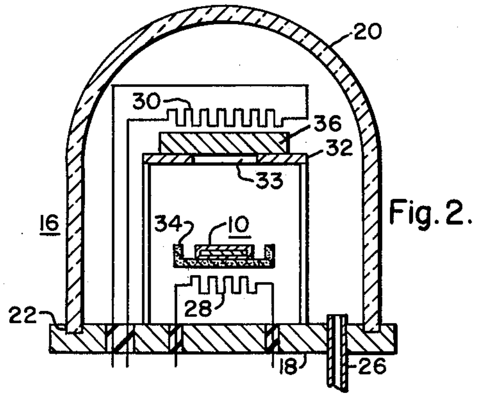
FIG. 2 is a vertical cross section of a bell jar furnace suitable for use in accordance with this invention.

The pellet 10 of FIG. 1 is employed in a vacuum vapor depositing apparatus. With reference to FIG. 2 there is illustrated a vacuum evaporization bell jar furnace 16 comprised of a metal base 18 which supports a glass bell jar 20. A close fit between the glass bell jar 20 and the base 18 is assured by disposing the jar 20 in a groove 22 containing a sealing material in base 18.

The base 18 has a port 26 through which the interior of bell jar 20 of furnace 16 may be evacuated. A first heating means 28 is disposed in the lower portion of the furnace, and a second heating means 30 is disposed in the upper portion of the furnace. A support member 32 having an aperture or passageway 33 therethrough is disposed in the upper portion of the furnace in close association with the heating means 30.

In carrying out the process of this invention, the doping alloy pellet 10 placed in a graphite boat 34 is disposed on the first heating means 28. A wafer of a semiconductor material 36, for example, a wafer comprised of silicon, germanium, indium-arsenide, gallium-phosphide, silicon carbide, or the like is disposed on the support member 32. However, for the purpose of clarity, the invention will be described in terms of a germanium wafer. The furnace is evacuated to a pressure of $10^{-4}$ or less mm. of mercury by evacuating the air out through port 26 by a suitable means (not shown).

Figure 3:
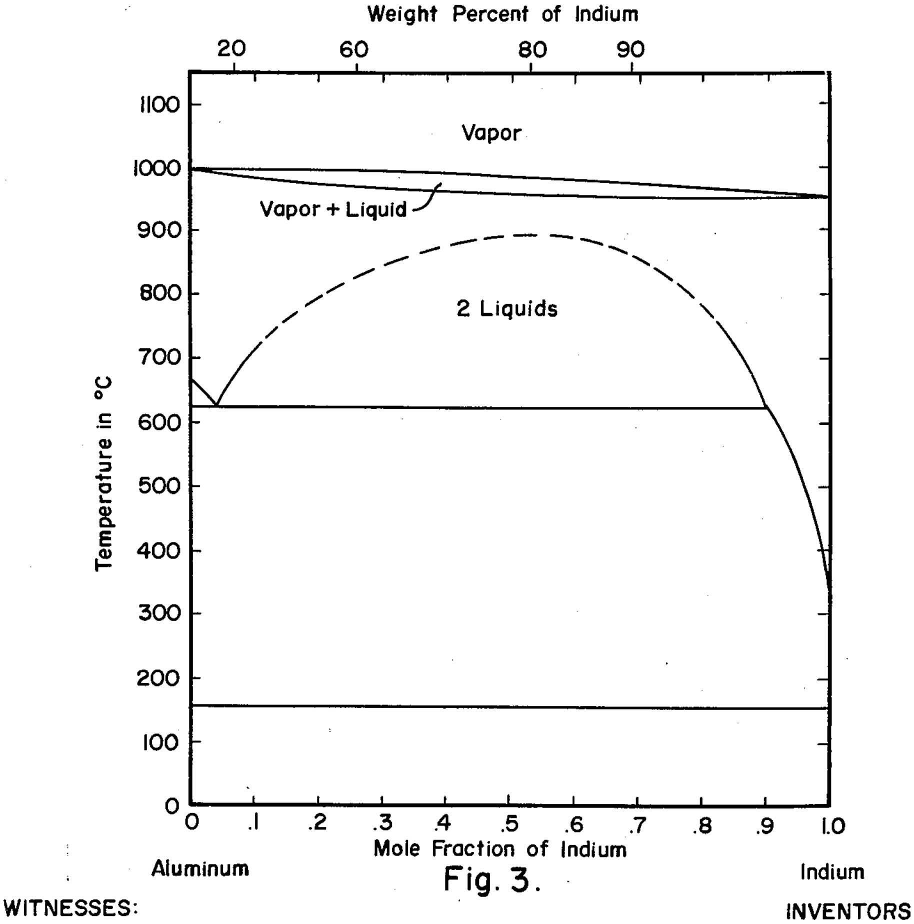
FIG. 3 is a vapor phase diagram of an aluminum indium alloy suitable for use in accordance with the teaching of this invention.

The heating means 28 is energized and the graphite boat and the pellet 10 are heated rapidly. Because of the difference in melting points, the indium (M.P. about 155° C.) melts first but is held within the aluminum shell until the shell melts. As the temperature rises, the aluminum and indium pass through the various stages set forth in the aluminum-indium phase diagram of FIG. 3. As the temperature reaches the range of approximately 900° C. to 1100° C. (depending on the original composition of the pellet 10) a homogeneous liquid results. From this homogeneous liquid a homogeneous vapor is evolved and is allowed to contact the surfaces of wafer 36, exposed through passage 33.

Initially, the wafer 36 is kept at a temperature below the melting point of germanium and aluminum but above the solidus of the aluminum-germanium system, for example, within a temperature range of 425° C. to 650° C. by heating means 30. As a result, the initially deposited aluminum, for example, from 0.0001 to 0.005 inch in thickness will alloy with the germanium and form an aluminum rich germanium alloy solution. Thereafter, while the evaporation process is continued, the germanium wafer is allowed to cool down slowly below the germanium-aluminum eutectic temperature and a thin layer of aluminum rich germanium of p-type semiconductivity crystal is regrown from the surface of the body of the original wafer to form a desired junction. Subsequently, the aluminum deposited upon the germanium layer is in the solid phase. The indium, being immiscible, tends to separate out and remains in a liquid phase distributed as very fine droplets but the resultant deposit comprises a solid aluminum matrix which interlocks the indium. Thus, on cooling below 155° C., a metastable alloy is obtained on the surface of the water 36.

Figure 4:
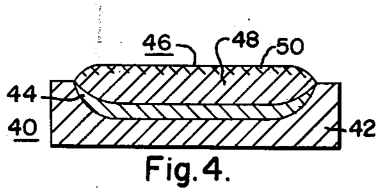
FIG. 4 is a side view in cross section of a semiconductor device prepared in accordance with the teaching of this invention.

With reference to FIG. 4, there is illustrated a semiconductor element 40 prepared as described above. Element 40 is comprised of an n-type germanium wafer 42, a p-type layer 44 resulting from the doping and regrowing of the germanium 42 and a layer of aluminum-indium metastable alloy 46 which is comprised of aluminum matrix 48 and disposed phase of indium 50.

A structure such as that shown in FIG. 4 can be easily soldered due to the presence of the indium in the alloy layer 46.

The following examples are illustrative of the practice of this invention.

*Example I*

A capsule pellet, similar to that illustrated in FIG. 1 and comprising 75% by weight aluminum and 25% by weight indium, was prepared by drilling a 1/16 inch diameter passage having a length of 9/16 inch in an aluminum rod having a diameter of 1/8 inch and a length of 5/8 inch. The passage was filled with a predetermined amount of indium and the end of the rod pinched over to seal the indium within the aluminum. The pellet was comprised of 75% by weight, aluminum and 25%, by weight, indium.

The pellet thus prepared was placed in a graphite boat and with an n-type germanium wafer was placed on a masking frame in a furnace similar to that illustrated in FIG. 2.

The furnace was evacuated to approximately $10^{-4}$ mm. of mercury.

The n-type germanium wafer was maintained at a temperature in the range of approximately 500° C. while the alloy pellet was rapidly heated to a temperature in the range of approximately 1000° C. whereupon a homogeneous indium aluminum liquid resulted. A homogeneous vapor comprised of 90% by weight aluminum and 10% by weight indium was evolved and allowed to contact selected surfaces on one face of the n-type germanium wafer and collect thereon. After approximately three minutes the germanium n-type wafer was allowed to cool to a temperature of about 350° C. to 400° C., germanium redeposited from the aluminum-indium layer upon the wafer thereby forming a p-type semiconductivity layer. A metastable aluminum indium layer was deposited over this germanium layer.

*Example II*

A germanium transistor was prepared wherein the emitter was made by the technique set forth in Example I. It was tested and found to have an average current gain of 63 at 1.5 amperes collector current.

While the invention has been described with reference to a particular embodiment and examples thereof, it will be understood, of course, that modifications, substitutions and the like may be made therein without departing from its scope.

We claim as our invention:

1. A process for forming a semiconductor device which comprises vapor depositing a readily solderable homogeneous doping alloy comprised of aluminum and indium from a single homogeneous melt, upon a body of an n-type semiconductive material while maintaining said body of n-type semiconductor material at a temperature below its melting point, below the melting point of the aluminum component of the doping alloy and above the melting point of indium, the aluminum and indium comprising the doping alloy being deposited simultaneously upon the body whereby, an aluminum rich region is formed within the body of semiconductor material, said aluminum rich region converting a portion of the body to a p-type semiconductivity, and a layer of metastable alloy comprised of indium and aluminum is formed on the outer surface of the aluminum rich region.

2. A process for forming a semiconductor device which comprises vapor depositing a homogeneous vapor from a single homogeneous melt comprised of an alloy comprising from 10% to 90%, by weight, aluminum and from 90% to 10%, by weight, of indium, upon a body of n-type semiconductive material selected from the group consisting of germanium and silicon, in a vacuum while maintaining the body of n-type semiconductive material at a temperature below its melting point, below the melting point of the aluminum and above the melting point of the indium, the aluminum and indium comprising the doping alloy being deposited simultaneously upon the body whereby, an aluminum rich region is formed within the body of semiconductor material, said aluminum rich region converting a portion of the body to a p-type semiconductivity, and a layer of a metastable alloy comprised of indium and aluminum is formed on the outer surface of the aluminum rich region.

3. A process for forming a semiconductor device which comprises preparing a homogenous melt of aluminum and indium of a predetermined composition, vaporizing the homogeneous melt, whereby a homogeneous vapor of aluminum and indium is formed, collecting the homogeneous vapor upon body of n-type semiconductive material while maintaining said body at a temperature below its melting point, below the melting point of aluminum and above the melting point of indium, and then continuing the collecting of vapor while allowing the body to cool to a temperature below that of an eutectic of aluminum and the n-type semiconductive material, whereby, an aluminum rich region is formed within the body of semiconductor material, said aluminum rich region converting a portion of the body to a p-type semiconductivity, and a layer of a metastable alloy comprised of indium and aluminum is formed on the outer surface of the aluminum rich region.

4. A process for forming a semiconductor device which comprises vapor depositing a homogeneous vapor of aluminum and indium from a single homogeneous melt comprising an alloy comprising 75% by weight aluminum and 25% by weight indium upon a body of n-type germanium while maintaining the n-type germanium at a temperature below its melting point, below the melting point of aluminum and above the melting point of the indium, whereby, an aluminum rich region is formed within the body of semiconductor material, said aluminum rich region converting a portion of the body to a p-type semiconductivity, and a layer of a metastable alloy comprised of indium and aluminum is formed on the outer surface of the aluminum rich region.

5. In a process for preparing a semiconductor device from a body comprised of n-type semiconductive material selected from the group consisting of silicon and germanium, the steps comprising forming an emitter by depositing upon one surface thereof an evaporated layer of a doping alloy from a single homogeneous melt comprised of aluminum and indium, the aluminum and indium comprising the doping alloy being deposited simultaneously upon the body whereby, an aluminum rich region is formed within the body of semiconductor material, said aluminum rich region converting a portion of the body to a p-type semiconductivity, and a layer of a metastable alloy comprised of indium and aluminum is formed on the outer surface of the aluminum rich region.

6. In a process for preparing a semiconductor device from a body comprised of n-type semiconductor material selected from the group consisting of silicon and germanium, the steps comprising forming an emitter by depositing upon one surface thereof an evaporated layer of a doping alloy from a single homogeneous melt comprised of from 10% to 90% aluminum and from 90% to 10% indium, the aluminum and indium comprising the doping alloy being deposited simultaneously upon the body whereby, an aluminum rich region is formed within the body of semiconductor material, said aluminum rich region converting a portion of the body to a p-type semiconductivity, and a layer of metastable alloy comprised of indium and aluminum is formed on the outer surface of the aluminum rich region.

References Cited in the file of this patent

UNITED STATES PATENTS

| | | |
|---|---|---|
| 2,464,821 | Ludwick et al. | Mar. 22, 1949 |
| 2,695,852 | Sparks | Nov. 30, 1954 |
| 2,845,894 | McIlvaine | Aug. 5, 1958 |
| 2,861,018 | Fuller et al. | Nov. 18, 1958 |
| 2,870,049 | Mueller et al. | Jan. 20, 1959 |
| 2,870,052 | Rittman | Jan. 20, 1959 |
| 2,873,222 | Derick et al. | Feb. 10, 1959 |
| 2,879,188 | Strull | Mar. 24, 1959 |
| 2,909,453 | Losco et al. | Oct. 20, 1959 |